United States Patent
Daviot et al.

(10) Patent No.: US 7,012,051 B2
(45) Date of Patent: Mar. 14, 2006

(54) INHIBITION OF TITANIUM CORROSION

(75) Inventors: Jerome Daviot, Glasgow (GB); Stanley Affrossman, Glasgow (GB); Douglas Holmes, Bridge of Weir (GB)

(73) Assignee: EKC Technology, Ltd., Glasgow (GB)

( * ) Notice: Subject to any disclaimer, the term of this patent is extended or adjusted under 35 U.S.C. 154(b) by 329 days.

(21) Appl. No.: 10/257,469

(22) PCT Filed: Apr. 12, 2001

(86) PCT No.: PCT/GB01/01686

§ 371 (c)(1),
(2), (4) Date: Jan. 16, 2003

(87) PCT Pub. No.: WO01/78129

PCT Pub. Date: Oct. 18, 2001

(65) Prior Publication Data
US 2004/0106530 A1 Jun. 3, 2004

(30) Foreign Application Priority Data
Apr. 12, 2000 (GB) .................................. 0009112

(51) Int. Cl.
C11D 3/30 (2006.01)
C11D 3/20 (2006.01)

(52) U.S. Cl. .................. 510/175; 510/176; 510/178; 510/201; 510/202; 510/254; 510/245; 510/255; 510/271; 510/432; 510/499; 134/1.3

(58) Field of Classification Search ............... 510/175, 510/176, 178, 201, 202, 254, 245, 255, 271, 510/432, 499; 134/1.3
See application file for complete search history.

(56) References Cited

U.S. PATENT DOCUMENTS

| | | | |
|---|---|---|---|
| 5,279,771 A | 1/1994 | Lee ....................... 252/548 |
| 5,334,332 A | 8/1994 | Lee ....................... 252/548 |
| 5,381,807 A | 1/1995 | Lee ....................... 134/2 |
| 5,482,566 A | 1/1996 | Lee ....................... 134/42 |
| 5,672,577 A * | 9/1997 | Lee ....................... 510/175 |
| 5,902,780 A | 5/1999 | Lee ....................... 510/176 |
| 5,911,835 A | 6/1999 | Lee et al. ................. 134/1.3 |
| 5,981,454 A | 11/1999 | Small ..................... 510/175 |
| 6,000,411 A | 12/1999 | Lee ....................... 134/1.2 |
| 6,110,881 A | 8/2000 | Lee et al. ................. 510/175 |
| 6,121,217 A | 9/2000 | Lee ....................... 510/176 |
| 6,140,287 A | 10/2000 | Lee ....................... 510/175 |
| 6,156,661 A | 12/2000 | Small ..................... 438/692 |
| 6,187,730 B1 | 2/2001 | Lee ....................... 510/175 |
| 6,221,818 B1 | 4/2001 | Lee ....................... 510/176 |
| 6,242,400 B1 | 6/2001 | Lee ....................... 510/176 |
| 6,276,372 B1 | 8/2001 | Lee ....................... 134/1.3 |
| 6,319,885 B1 | 11/2001 | Lee et al. ................. 510/175 |
| 6,323,168 B1 | 11/2001 | Kloffenstein et al. ....... 510/175 |
| 6,367,486 B1 | 4/2002 | Lee et al. ................. 134/1.3 |
| 6,399,551 B1 | 6/2002 | Lee ....................... 510/175 |
| 6,492,311 B1 | 12/2002 | Lee et al. ................. 510/176 |
| 6,546,939 B1 | 4/2003 | Small ..................... 134/1.3 |
| 6,564,812 B1 | 5/2003 | Lee ....................... 134/1.3 |
| 6,825,156 B1 | 11/2004 | Lee et al. ................. 510/176 |
| 2002/0052301 A1 | 5/2002 | Lee et al. ................. 510/175 |
| 2002/0068685 A1 | 6/2002 | Wojtczak et al. .......... 510/175 |
| 2003/0032567 A1 | 2/2003 | Lee et al. ................. 510/175 |
| 2004/0018949 A1 | 1/2004 | Lee ....................... 510/175 |
| 2004/0067860 A1 | 4/2004 | Lee ....................... 510/175 |
| 2004/0147420 A1 | 7/2004 | Zhou et al. ............... 510/176 |

FOREIGN PATENT DOCUMENTS

| | | |
|---|---|---|
| EP | 0 578 507 A2 | 1/1994 |
| EP | 578507 * | 1/1994 |
| WO | WO 98/00244 | 1/1998 |

OTHER PUBLICATIONS

International Search Report dated Aug. 21, 2001, for PCT Application No. PCT/GB01/01686.

* cited by examiner

Primary Examiner—Charles Boyer
(74) Attorney, Agent, or Firm—Morgan, Lewis & Bockius, LLP

(57) ABSTRACT

A composition for removing resist, polymeric material and/or etching residue from a substrate comprising titanium or an alloy thereof, the composition comprising hydroxylamine or a derivative thereof and at least one compound having the general formula (I) wherein: $R^1$ and $R^3$ are each independently selected from H, OH, $CO_2H$, halogen, $C_1$–$C_3$ alkyl, $C_1$–$C_3$ alkoxy or $(CH_2)_n OH$ wherein n is 1, 2 or 3; and $R_2$ is selected from $C_9$–$C_{16}$ alkyl, or $C_9$–$C_{16}$ alkoxy (I)

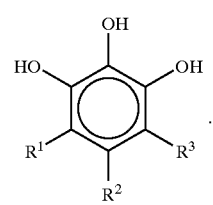

42 Claims, 2 Drawing Sheets

INHIBITION OF TITANIUM CORROSION

This application is a national stage filing of International Application No. PCT/GB01/01686, filed Apr. 12, 2001, which claims the benefit of GB Application No. 0009112.4, filed Apr. 12, 2000.

The present invention relates to the inhibition of titanium corrosion and, in particular, to compounds, compositions and methods used for the inhibition of titanium corrosion.

Titanium finds application in metallization layers in semiconductor structures. Both the pure element and alloys thereof may be used as barrier layers to prevent electromigration of certain atoms and/or as anti-reflective layers on top of other metals. The reduction of interconnect dimensions in semiconductor manufacture is leading to the replacement of aluminum by titanium as the metallization layer in semiconductor materials and corrosion and electrolyte etching is a major factor in interconnect deterioration.

Titanium forms a thin layer of a surface oxide and corrosion inhibition can be associated with retention of this surface layer. Titanium is an amphoteric metal which dissolves (corrodes) readily at both low and high pH. Small amounts of corrosion which occur at neutral pH tend to lower the pH at cathodic sites and increase the pH at anodic sites. Buffering chemicals which ameliorate development of this pH differential can inhibit corrosion. Organic molecules able to complex with the surface oxide layer can suppress crack formation and can also stabilize the metals.

The need to inhibit titanium corrosion is very important: a 40 nm structure found in 0.25 $\mu$m technology is only approximately 100 titanium atoms deep and loss of only a few atoms can have a significant effect on circuit performance and durability.

As integrated circuit manufacture has become more complex and the dimensions of circuit elements fabricated on silicon or other semiconductor wafers have become smaller, continued improvements in the techniques used to remove photoresists and other polymeric materials and residues formed from such materials have been required. Photoresists and other polymeric materials, such as polyimides, are often subjected to ion implantation, plasma etching, reactive ion etching or ion milling during the fabrication process to define patterns in the substrate. Oxygen plasma oxidation is also often used for removal of photoresists and other polymeric materials after their use during the semiconductor fabrication process. Such high-energy processes may result in the hardening of the photoresist and the formation of organometallic compounds and other residues on sidewalls of the structures being formed. During the processing of wafers, reactive stripper solutions comprising hydroxylamine may be used during the post-metallisation stages for removal of resist residues and deposits left after plasma etch treatments. Examples of reactive stripper solutions suitable for these processes are disclosed in the Applicant's U.S. Pat. Nos. 5,279,771 and 5,334,332. However, hydroxylamine also initiates chemical attack and consequent corrosion of the titanium layer.

Catechol has previously been added to certain reactive strippers to stabilize the hydroxylamine and it has also been observed that the addition of catechol also has a beneficial activity in inhibiting the corrosion of titanium. Whilst the mode of action of catechol is not known, it is considered that catechol may decrease the surface reactivity either by binding to the solid or by influencing the pH at the interface, or both.

Although catechol inhibits titanium corrosion to some extent, it would be advantageous to provide improved inhibitors. Furthermore, the toxicity of catechol makes the identification of alternative inhibitors desirable. Accordingly, in a first embodiment, the present invention provides a composition for removing resist, polymeric material and/or etching residue from a substrate comprising hydroxylamine or a derivative thereof and at least one compound having the general formula (I) as shown below:

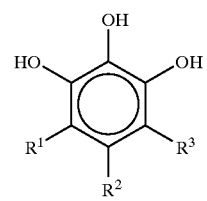

Formula (I)

wherein:
$R^1$ and $R^3$ are each independently selected from H, OH, $CO_2H$, halogen, $C_1$–$C_3$ alkyl, $C_1$–$C_3$ alkoxy or $(CH_2)_n OH$ wherein n is 1, 2 or 3; and $R_2$ is selected from $C_9$–$C_{16}$ alkyl, or $C_9$–$C_{16}$ alkoxy.

Preferably, $R_2$ is selected from $C_9$, $C_{10}$, $C_{11}$ or $C_{12}$ alkyl, or from $C_9$, $C_{10}$, $C_{11}$ or $C_{12}$ alkoxy.

The composition according to the present invention is particularly useful as a stripping composition for removing resist material during the manufacture of semiconductor integrated circuits. Resist materials which may be removed by the composition of the present invention include positive photoresists comprising, for example, ortho-naphthoquinone diazide sulfonic acid ester or amide sensitizer with novolak-type binders or resins. The composition may also be used to remove cured and uncured polymer resists comprising, for example, a polyimide, organometallic polymers formed on a substrate during plasma etching processes, sidewall polymeric materials and metal oxide residues.

The composition according to the present invention may also be used as a cleaning composition for removing etching residue during the manufacture of semiconductor integrated circuits.

Examples of suitable substrates include metal substrates comprising titanium and alloys thereof, such as titanium/tungsten, titanium/aluminum, titanium/copper, titanium/tungsten/aluminum, titanium/copper/aluminum, titanium/tungsten/copper and titanium/tungsten/copper/aluminum. The substrate may also comprise, for example, a semiconductor wafer having on a surface thereof titanium or an alloy of titanium. Examples of suitable substrates are well known in the semiconductor industry and include silicon, silicon oxide, silicon nitride, gallium arsenide, and plastics, such as polycarbonate, which have on a surface thereof at least a portion comprising titanium or an alloy thereof.

In the composition according to the present invention, the compound having the general formula (I) is preferably selected from one or more of 3,4,5-trihydroxy-nonyl-benzene, 3,4,5-trihydroxy-decyl-benzene, 3,4,5-trihydroxy-undecyl-benzene, 3,4,5-trihydroxy-dodecylnyl-benzene, and 3,4,5-trihydroxy-tridecyl-benzene.

The composition advantageously further comprises a solvent, for example a polar solvent, which is preferable miscible with the hydroxylamine. Suitable examples include solvents selected from one or more of an alkanolamine, water, dimethyl sulfoxide, ethylene glycol, ethylene glycol alkyl ether, diethylene glycol alkyl ether (e.g. diethylene glycol butyl ether), triethylene glycol alkyl ether (e.g. triethylene glycol butyl ether), propylene glycol, propylene glycol alkyl ether, dipropylene glycol alkyl ether (e.g. dipropylene glycol ethyl ether), tripropylene glycol alkyl ether, N-substituted pyrrolidone (e.g. N-methyl-2-pyrrolidone), ethylenediamine, ethylenetriamine, diethylenetriamine, dimethyl formamide and dimethyl acetamide. The most preferred solvent is an alkanolamine. The addition of a solvent strengthens the effectiveness of the composition, particularly when it is used as a stripping composition for removing resist material from a substrate.

In a preferred embodiment the composition comprises at least 5 wt % hydroxylamine, at least 10 wt % of one or more alkanolamines and from 0.5 to 30 wt % (preferably from 2 to 30 wt %) of one or more compounds having the general formula (I), with any remaining balance consisting of one or more of the solvents recited above (the most preferable being one or both of water and/or dimethyl sulfoxide). More preferably, the composition comprises from 10 to 70 wt % hydroxylamine, from 30 to 60 wt % of one or more alkanolamines and from 5 to 15 wt % of one or more compounds having the general formula (I), with any remaining balance consisting of any of the solvents recited above (the most preferable being one or both of water and/or dimethyl sulfoxide).

The hydroxylamine suitable for use in the present invention has the structure $NH_2OH$. It may be conveniently provided in the form of a commercially available aqueous solution (about 50 wt %) from Nissin Chemical. Derivatives of hydroxylamine, such as a salt thereof, may also be used.

Alkanolamines suitable for use in the present invention are preferably miscible with the hydroxylamine and are preferably water-soluble. Additionally, the alkanolamines useful in the present invention preferably have relatively high boiling points, preferably 75° C. or above. Suitable alkanolamines are primary, secondary or tertiary amines and are preferably monoamines, diamines or triamines, and, most preferably, monoamines. The alcohol group of the alkanolamines preferably has from 1 to 6 carbon atoms, and can be based on a linear, branched or cyclic alcohol.

Preferred alkanolamines suitable for use in the composition according to the present invention can be represented by the chemical formula:

$R_1R_2$—N—$CH_2CH_2$—O—$R_3$ wherein: $R_1$ and $R_2$ can each independently be H, $CH_3$, $CH_3CH_2$ or $CH_3CH_2OH$ and $R_3$ is $CH_3CH_2OH$.

Examples of suitable alkanolamines include monoethanolamine, diethanolamine, triethanolamine, tertiarybutyldiethanolamine, isopropanolamine, diisopropanolamine, 2-amino-1-propanol, 3-amino-1-propanol, isobutanolamine, 2-(2-aminoethoxy)ethanol (diglycolamine), 2-(2-aminoethoxy)propanol and 1-hydroxy-2-aminobenzene.

A particularly preferred composition for use as a stripper solution consists of a solvent made up of about 37 wt % hydroxylamine solution (50:50 hydroxylamine:water by weight), about 63 wt % of diglycolamine, and one or more compounds having the general formula (I) as herein described added thereto so as to provide a concentration of about 0.2M.

The present invention also provides a process for removing resist, polymeric material and/or etching residue from a substrated comprising titanium or an alloy thereof, the process comprising contacting the substrate with a composition as hereinbefore described at a temperature and for a time sufficient to remove the resist, polymeric material and/or etching residue from the substrate.

The temperature is preferably in the range of from 20 to 150° C., more preferably 60 to 70° C., whilst the contact time is preferably in the range of from 2 to 60 minutes, more preferably 2 to 20 minutes, even more preferably 2 to 5 minutes. The process will generally be carried out at atmospheric pressure. Suitable substrates have been described above and include, for example, a semiconductor wafer having on a surface thereof titanium or an alloy of titanium.

The process may further comprise the step of rinsing the substrate with a suitable rinsing composition following substantial removal of the resist, polymeric material and/or etching residue from the substrate. Preferably the rinsing composition comprises a polar solvent or an aqueous solution having a pH in the range of from 2 to 5. Suitable examples of rinsing compositions include isopropyl alcohol, N-methylpyrrolidone, dimethyl sulfoxide, dilute citric acid and/or dilute acetic acid. Alternatively, the substrate may be rinsed with a rinsing composition as described in the applicant's International Patent Application (WO 98/36045). These compositions comprise a monofunctional, difunctional or trifunctional organic acid and a buffering amount of a quarternary amine, ammonium hydroxide, hydroxylamine, hydroxylamine salt, hydrazine or hydrazine salt base. The rinsing step may be followed by water rinse, preferably a deionised water rinse, and finally a drying step such as vapour IPA drying.

In another aspect, the present invention provides a method of inhibiting corrosion of a substrate comprising titanium or an alloy thereof, the method comprising contacting the substrate with one or more compounds selected from those having the general formula (I) as shown below:

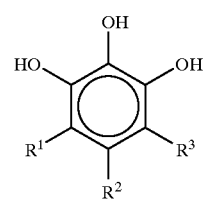

Formula (I)

wherein:

$R^1$ and $R^3$ are each independently selected from H, OH, $CO_2H$, halogen, $C_1$–$C_3$ alkyl, $C_1$–$C_3$ alkoxy or $(CH_2)_nOH$ wherein n is 1, 2 or 3; and $R_2$ is selected from $C_9$–$C_{16}$ alkyl, or $C_9$–$C_{16}$ alkoxy.

Preferably, $R_2$ is selected from $C_9$, $C_{10}$, $C_{11}$ or $C_{12}$ alkyl, or $C_9$, $C_{10}$, $C_{11}$ or $C_{12}$ alkoxy.

The compound having the general formula (I) may be provided in a composition comprising hydroxylamine or a derivative thereof or it may be provided in a composition comprising a solvent as hereinbefore described.

In the method according to the present invention, the compound having the general formula (I) may preferably be selected from one or more of 3,4,5-trihydroxy-nonyl-benzene, 3,4,5-trihydroxy-decyl-benzene, 3,4,5-trihydroxy-undecyl-benzene, 3,4,5-trihydroxy-dodecyl-benzene, and 3,4,5-trihydroxy-tridecyl-benzene.

Preferably, the compound having the general formula (I) is used in the method according to the present invention as a constituent in compositions comprising hydroxylamine or a derivative thereof and preferably at least one alkanolamine as herein described. Examples of such stripping and cleaning compositions have been described above. Suitable substrates have also been described above and include, for example, a semiconductor wafer having on a surface thereof titanium or an alloy of titanium.

The present invention still further provides for the use of a compound having the general formula (I) as shown below in a stripper or cleaning composition for removing resist, polymeric material and/or etching residue from a substrate, which substrate comprises titanium or an alloy thereof:

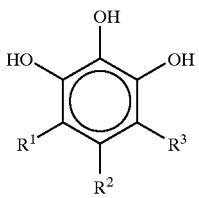

Formula (I)

wherein:

$R^1$ and $R^3$ are each independently selected from H, OH, $CO_2H$, halogen, $C_1$–$C_3$ alkyl, $C_1$–$C_3$ alkoxy or $(CH_2)_n OH$ wherein n is 1, 2 or 3; and $R_2$ is selected from $C_9$–$C_{16}$ alkyl, or $C_9$–$C_{16}$ alkoxy.

Preferably, $R_2$ is selected from $C_9$, $C_{10}$, $C_{11}$ or $C_{12}$ alkyl, or $C_9$, $C_{10}$, $C_{11}$ or $C_{12}$ alkoxy.

In this aspect, the compound having the general formula (I) is most preferably selected from one or more of 3,4,5-trihydroxy-nonyl-benzene, 3,4,5-trihydroxy-decyl-benzene, 3,4,5-trihydroxy-undecyl-benzene, 3,4,5-trihydroxy-dodecyl-benzene, and 3,4,5-trihydroxy-tridecyl-benzene.

The present invention also provides for the use of a compound having the general formula (I) as shown below as a corrosion inhibitor in a stripper or cleaning composition for removing resist, polymeric material and/or etching residue from a substrate, which substrate comprises titanium or an alloy thereof.

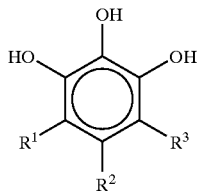

Formula (I)

wherein:

$R^1$ and $R^3$ are each independently selected from H, OH, $CO_2H$, halogen, $C_1$–$C_3$ alkyl, $C_1$–$C_3$ alkoxy or $(CH_2)_n OH$ wherein n is 1, 2 or 3; and $R_2$ is selected from $C_9$–$C_{16}$ alkyl, or $C_9$–$C_{16}$ alkoxy.

Preferably, $R_2$ is selected from $C_9$, $C_{10}$, $C_{11}$ or $C_{12}$ alkyl, or $C_9$, $C_{10}$, $C_{11}$ or $C_{12}$ alkoxy.

In this aspect, the compound having the general formula (I) is preferably selected from one or more of 3,4,5-trihydroxy-nonyl-benzene, 3,4,5-trihydroxy-decyl-benzene, 3,4,5-trihydroxy-undecyl-benzene, 3,4,5-trihydroxy-dodecyl-benzene, and 3,4,5-trihydroxy-tridecylbenzene.

Examples of stripping and cleaning compositions have been described above. Suitable substrates have also been described above and include, for example, a semiconductor wafer having on a surface thereof titanium or an alloy of titanium.

The present invention will now be described with reference to the following experimental tests. The experiments refer to the following figures.

EXAMPLES

Materials:

Titanium coated wafers were obtained from International Wafer Service. 3,4,5-trihydroxy-n-alkyl-benzene compounds were synthesised by the general reaction scheme shown below:

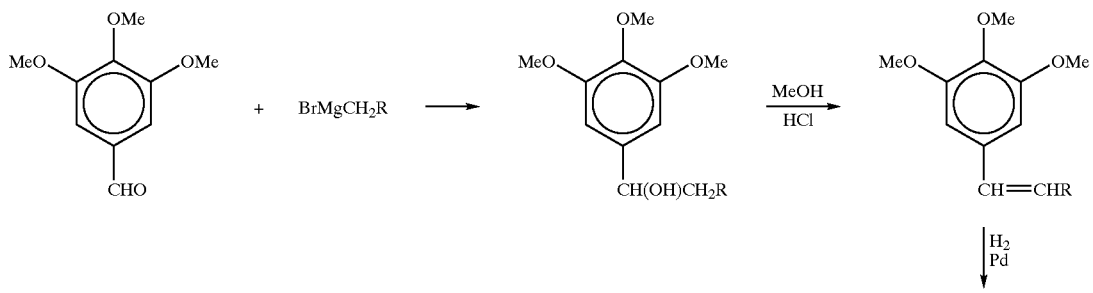

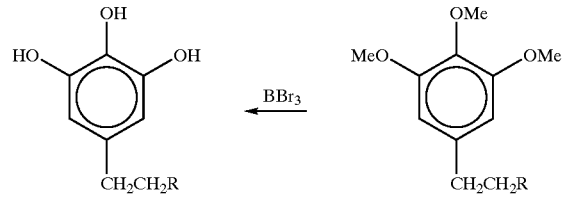

Purification:

All corrosion inhibitors tested were analysed for traces of calcium using Atomic Absorption Spectroscopy. The calcium signals were compared to those of standard methanol solutions. The inhibitors which contained unacceptable amounts of calcium were purified by passage through an ion exchange column (Dowex 50WX8) until the calcium level was reduced to below 2 ppm.

Measurement of Titanium Film Thickness:

The thickness of the metal layer is directly related to its conductivity. Therefore the resistance of the film was determined using a 4-point probe (Keither 2010) and the conductivity was taken as a measure of the thickness.

Corrosion Studies:

The corrosive solution used in the tests consisted of 35 wt % aqueous hydroxylamine solution (50:50 hydroxylamine:water) and 60 wt % diglycolamine. Compounds being tested as corrosion inhibitors were added in an amount of 5% w/w.

Figure 1:
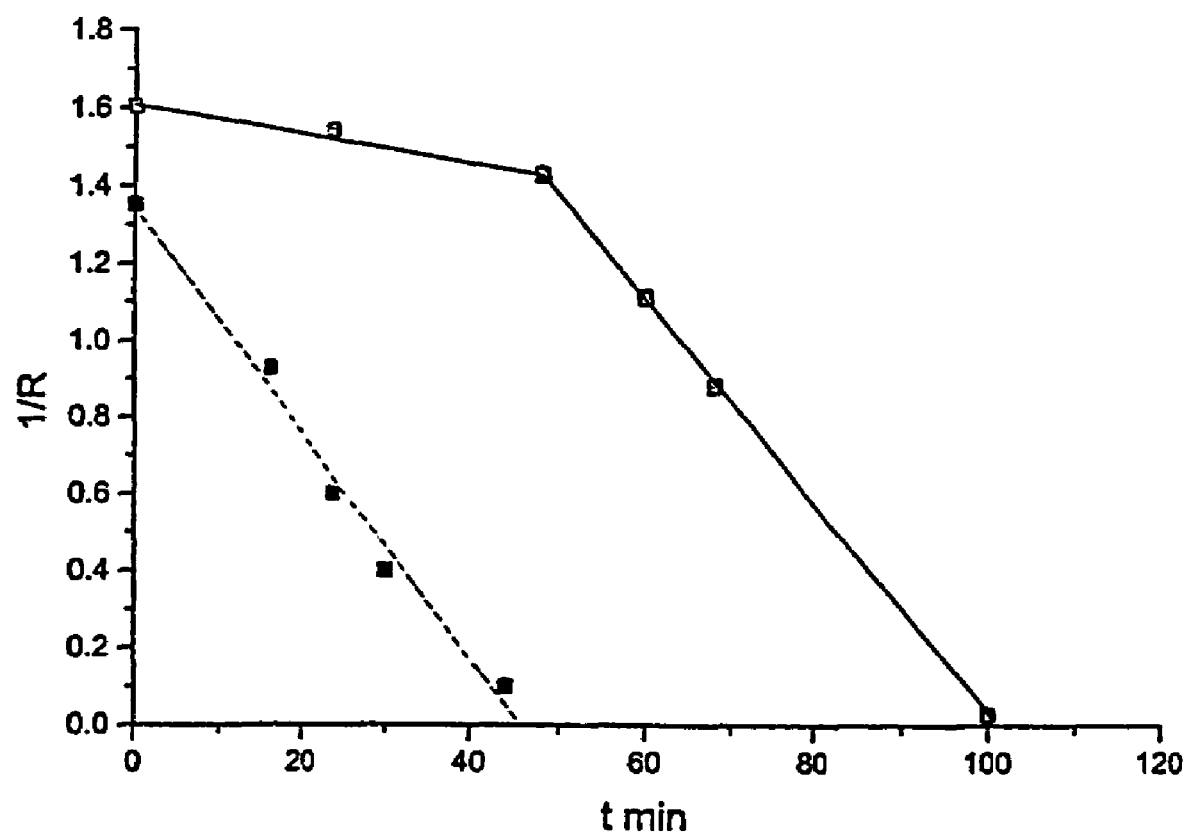
FIG. 1 is a plot of titanium film conductance versus time upon exposure to a corrosive solution (hydroxylamine/diglycolamine) and upon exposure to the same corrosive solution containing a corrosion inhibitor (catechol).
Figure 2:
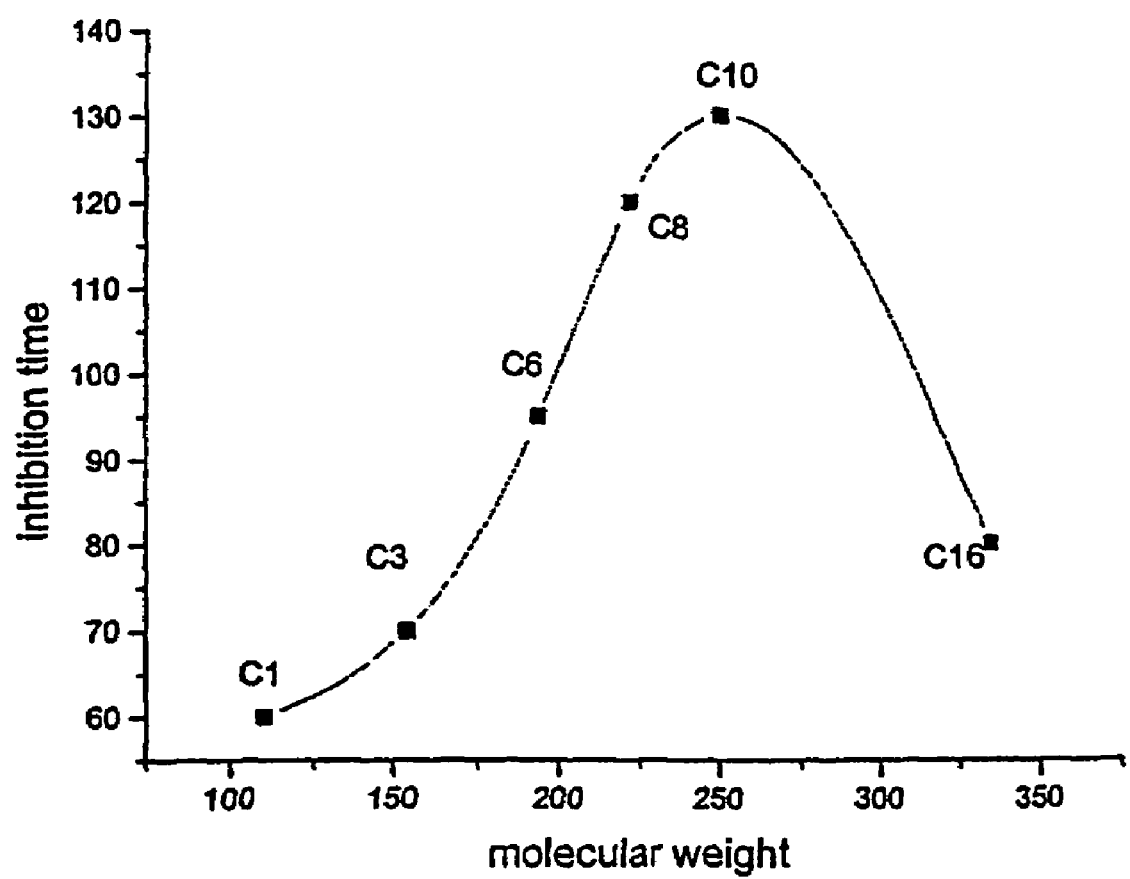
FIG. 2 is a plot of inhibition time versus the molecular weight a series of n-alkyl substituted corrosion inhibitors.

Pieces of silicon wafer coated with 200 nm titanium were suspended in the corrosive solution and periodically removed for measuement of the film resistance. In the absence of inhibitor the film conductivity decreased linearly with time as shown in FIG. 1 (dotted line). FIG. 1 also shows for comparison the change in conductivity when 5% w/w catechol is included in the corrosive solution (solid line). It can be seen that catechol delays the onset of corrosion. The time taken to remove the film completely is indicated by the point of intersection of the plot with the x-axis. The difference between the time taken to remove the film in the presence of inhibitor and in the absence of inhibitor is referred to as the inhibition time (Δt). For catechol Δt is approximately 55 mins. The solution temperature was 65° C. The inhibition times for a series of 3,4,5-trihydroxy-n-alkyl-benzene compounds were measured in the same way. FIG. 2 shows a plot of the inhibition time (mins) versus the molecular weight of the tested compound.

The invention claimed is:

1. A composition for removing resist, polymeric material and/or etching residue from a substrate comprising titanium or an alloy thereof, the composition comprising hydroxylamine or a derivative thereof and at least one compound having the general formula (I) as shown below:

Formula (I)

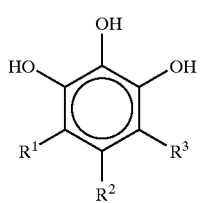

wherein:

$R^1$ and $R^3$ are each independently selected from H, OH, $CO_2H$, halogen, $C_1$–$C_3$ alkyl, $C_1$–$C_3$ alkoxy or $(CH_2)_n$OH wherein n is 1, 2 or 3; and $R_2$ is selected from $C_9$–$C_{16}$ alkyl, or $C_9$–$C_{16}$ alkoxy.

2. A composition as claimed in claim 1 wherein $R_2$ is selected from $C_9$, $C_{10}$, $C_{11}$ or $C_{12}$ alkyl, or $C_9$, $C_{10}$, $C_{11}$ or $C_{12}$ alkoxy.

3. A composition as claimed in claim 1 wherein the at least one compound of formula (I) is selected from the group consisting of 3,4,5-trihydroxy-nonyl-benzene, 3,4,5-trihydroxy-decyl-benzene, 3,4,5-trihydroxy-undecyl-benzene, 3,4,5-trihydroxy-dodecyl-benzene, and 3,4,5-trihydroxy-tridecyl-benzene.

4. A composition as claimed in claim 1 or claim 3 wherein the hydroxylamine is provided in an aqueous solution.

5. A composition as claimed in claim 3 wherein the hydroxylamine is provided in an aqueous solution at a hydroxylamine to water weight ratio of approximately 1:1 by weight.

6. A composition as claimed in claim 1 or claim 3 further comprising a solvent which is miscible with the hydroxylamine or derivative thereof.

7. A composition as claimed in claim 1 or claim 3 further comprising a solvent selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamme.

8. A composition as claimed in claim 1 or claim 3 comprising at least about 5 wt % hydroxylamine, said composition further comprises at least about 10 wt % of one or more alkanolamines and from about 0.5 to about 30 wt % of one or more compounds of formula (I), with the balance consisting of one or more solvents miscible with the hydroxylamme.

9. A composition as claimed in claim 1 or claim 3 comprising at least about 5 wt % hydroxylamine, said composition further comprises at least about 10 wt % of one or more alkanolamines and from about 0.5 to about 30 wt % of one or more compounds of formula (I), with the balance consisting of one or more solvents selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

10. A composition as claimed in claim 1 or claim 3 comprising from about 10 to about 70 wt % hydroxylamine, said composition further comprises from about 30 to about 60 wt % of one or more alkanolamines and from about 5 to about 15 wt % of one or more compounds of formula (I), with the balance consisting of one or more solvents miscible with the hydroxylamine.

11. A composition as claimed in claim 1 or claim 3 comprising from about 10 to about 70 wt % hydroxylamine, said composition further comprises from about 30 to about 60 wt % of one or more alkanolamines and from about 5 to about 15 wt % of one or more compounds of formula (I), with the balance consisting of one or more solvents selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

12. A composition as claimed in claim 1 or claim 3 comprising at least about 5 wt % hydroxylamine, said composition further comprises at least about 10 wt % of one or more alkanolamines and from about 0.5 to about 30 wt % of one or more compounds of formula (I), with the balance consisting of a solvent selected from the group consisting of water and dimethyl sulfoxide.

13. A composition as claimed in claim 1 or claim 3 comprising from about 10 to about 70 wt % hydroxylamine, said composition further comprises from about 30 to about 60 wt % of one or more alkanolamines and from about 5 to about 15 wt % of one or more compounds of formula (I), with the balance consisting of a solvent selected from the group consisting of water and dimethyl sulfoxide.

14. A composition as claimed in claim 1 or claim 3 comprising at least about 5 wt % hydroxylamine, said composition further comprises at least about 10 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from about 0.5 to about 30 wt % of one or more compounds of formula (I), with the balance consisting of one or more solvents miscible with the hydroxylamine.

15. A composition as claimed in claim 1 or claim 3 comprising at least about 5 wt % hydroxylamine, said composition further comprises at least about 10 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from about 0.5 to about 30 wt % of one or more compounds of formula (I), with the balance consisting of one or more solvents selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

16. A composition as claimed in claim 1 or claim 3 comprising from about 10 to about 70 wt % hydroxylamine, said composition further comprises from about 30 to about 60 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from about 5 to about 15 wt % of one or more compounds of formula (I), with the balance consisting of one or more solvents miscible with the hydroxylamine.

17. A composition as claimed in claim 1 or claim 3 comprising from about 10 to about 70 wt % hydroxylamine, said composition further comprises from about 30 to about 60 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from about 5 to about 15 wt % of one or more compounds of formula (I), with the balance consisting of one or more solvents selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

18. A composition as claimed in claim 1 or claim 3 comprising at least about 5 wt % hydroxylamine, said composition further comprises at least about 10 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from about 0.5 to about 30 wt % of one or more compounds of formula (I), with the balance consisting of a solvent selected from the group consisting of water and dimethyl sulfoxide.

19. A composition as claimed in claim 1 or claim 3 comprising from about 10 to about 70 wt % hydroxylamine, said composition further comprises from about 30 to about 60 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from about 5 to about 15 wt % of one or more compounds of formula (I), with the balance consisting of a solvent selected from the group consisting of water and dimethyl sulfoxide.

20. A process for removing resist, polymeric material and/or etching residue from a substrate comprising titanium or an alloy thereof, the process comprising contacting the substrate with a composition as claimed in claim 1 or claim 3 at a temperature and for a time sufficient to substantially remove the resist, polymeric material and/or etching residue from the substrate.

21. A process for removing resist, polymeric material and/or etching residue from a substrate comprising titanium or an alloy thereof, the process comprising contacting the substrate with a composition as claimed in claim 1 or claim 3 at a temperature and for a time sufficient to substantially remove the resist, polymeric material and/or etching residue from the substrate, said composition further comprise one or more solvents selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

22. A process for removing resist, polymeric material and/or etching residue from a substrate comprising titanium or an alloy thereof, the process comprising contacting the substrate with a composition as claimed in claim 1 or claim 3 at a temperature in the range of from about 20 to about 150° C. for a time in the range of from about 2 to about 60 minutes.

23. A process for removing resist, polymeric material and/or etching residue from a substrate comprising titanium or an alloy thereof, the process comprising contacting the substrate with a composition as claimed in claim 1 or claim 3 at a temperature and for a time sufficient to substantially remove the resist, polymeric material and/or etching residue from the substrate, wherein the substrate comprises a semiconductor wafer having on a surface thereof titanium or an alloy of titanium.

24. A process for removing resist, polymeric material and/or etching residue from a substrate comprising titanium or an alloy thereof, the process comprising contacting the substrate with a composition as claimed in claim 1 or claim 3 at a temperature and for a time sufficient to substantially remove the resist, polymeric material and/or etching residue from the substrate, further comprising the step of rinsing the substrate with a rinsing composition following the substantial removal of the resist, polymeric material and/or etching residue from the substrate.

25. A process for removing resist, polymeric material and/or etching residue from a substrate comprising titanium or an alloy thereof, the process comprising contacting the substrate with a composition as claimed in claim 1 or claim 3 at a temperature and for a time sufficient to substantially remove the resist, polymeric material and/or etching residue from the substrate, wherein the substrate comprises a semiconductor wafer having on a surface thereof titanium or an alloy of titanium.

26. The process of claim 24, wherein the substrate comprises a semiconductor wafer having on a surface thereof titanium or an alloy of titanium wherein the rinsing composition comprises a polar solvent or an aqueous solution having a pH in the range of from about 2 to about 5.

27. The process of claim 24, wherein the substrate comprises a semiconductor wafer having on a surface thereof titanium or an alloy of titanium wherein the rinsing composition comprises one or more compounds selected from the group consisting of isopropyl alcohol, dimethyl sulfoxide, N-methylpyrrolidone, dilute citric acid and dilute acetic acid.

28. The process of claim 24, wherein the substrate comprises a semiconductor wafer having on a surface thereof titanium or an alloy of titanium, wherein the rinsing composition comprises a monofunctional, difunctional or trifunctional organic acid and a buffering amount of a quartemary amine, ammonium hydroxide, hydroxylamine, hydroxylamine salt, hydrazine or hydrazine salt base.

29. The process of claim 24, wherein the substrate comprises a semiconductor wafer having on a surface thereof titanium or an alloy of titanium wherein the rinsing composition comprises one or more compounds selected from the group consisting of isopropyl alcohol, dimethyl sulfoxide, N-methylpyrrolidone, dilute citric acid and dilute acetic acid, wherein the step of rinsing is followed by a water rinse and then a drying step.

30. The process of claim 24, wherein the substrate comprises a semiconductor wafer having on a surface thereof titanium or an alloy of titanium, wherein the rinsing composition comprises a monofunctional, difunctional or trifunctional organic acid and a buffering amount of a quartemary amine, animonium hydroxide, hydroxylamine, hydroxylamine salt, hydrazine or hydrazine salt base, wherein the step of rinsing is followed by a water rinse and then a drying step.

31. A process for removing resist, polymeric material and/or etching residue from a substrate comprising titanium or an alloy thereof, the process comprising contacting the substrate with a composition as claimed in claim 3 at a temperature and for a time sufficient to substantially remove the resist, polymeric material and/or etching residue from the substrate, wherein said composition comprising from about 10 to about 70 wt % hydroxylamine, said composition further comprises from about 30 to about 60 wt % of one or more alkanolamines selected from the group consisting of monoethanolamine, diethanolamine, triethanolamine, tertiarybutyldiethanolamine, isopropanolamine, diisopropanolamine, 2-amino-1-propanol, 3-amino-1-propanol, isobutanolamine, 2-amino-2-ethoxyethanol (diglycolamine), 2-amino-2-ethoxy-propanol and 1-hydroxy-2-aminobenzene and from 5 to about 15 wt % of one or more compounds of formula (I).

32. The process of claim 31, wherein the balance of the composition consists of one or more solvents selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

33. The process of claim 32, further comprising the step of rinsing the substrate with a rinsing composition following the substantial removal of the resist, polymeric material and/or etching residue from the substrate.

34. The process of claim 33, wherein the substrate comprises a semiconductor wafer having on a surface thereof titanium or an alloy of titanium.

35. The process of claim 33, wherein the rinsing composition comprises a polar solvent or an aqueous solution having a pH in the range of from about 2 to about 5.

36. A method of inhibiting corrosion of a substrate comprising titanium or an alloy thereof, the method comprising contacting the substrate with one or more compounds selected from those having the general formula (I) as shown below:

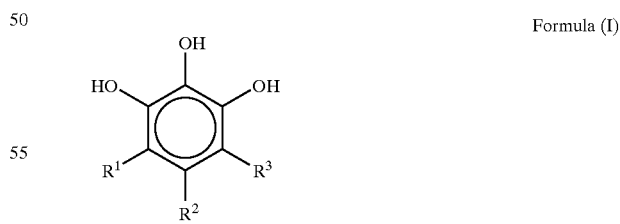

Formula (I)

wherein:
R$^1$ and R$^3$ are each independently selected from H, OH, CO2H, halogen, C$_1$–C$_3$ alkyl, C$_1$–C$_3$ alkoxy or (CH$_2$)$_n$ OH wherein n is 1, 2 or 3; and R$_2$ is selected from C$_1$–C$_{16}$ alkyl, or C$_9$–C$_{16}$ alkoxy.

37. The method of claim 36, wherein the compound is provided in a composition comprising hydroxylamine or a derivative thereof.

38. The method of claim 37, wherein the compound is provided in a composition further comprising a solvent.

39. The method of claim 38, wherein the solvent is one or more compounds selected from the group consisting of an alkanolamine, water, dimethyl sulfoxide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine and ethylenetriamine.

40. The method claim 36, wherein the compound is provided in a composition comprising hydroxylamine or a derivative thereof and at least one alkanolamine which is miscible with the hydroxylamine.

41. The method of claim 40, wherein the compound is provided in a composition comprising from about 10 to about 70 wt % hydroxylamine, from about 30 to about 60 wt % of one or more alkanolamines and from about 5 to about 15 wt % of one or more compounds of formula (I), wherein the balance of the composition consists of one or more solvents.

42. The method of claim 41, wherein the compound of formula (I) is one or more compounds selected from the group consisting of 3,4,5-trihydroxy-nonyl-benzene, 3,4,5-trihydroxy- decyl-benzene, 3,4,5-trihydroxy-undecyl-benzene, 3,4,5-trihydroxy-dodecyl-benzene, and 3,4,5-trihydroxy-tridecyl-benzene.

* * * * *